(12) United States Patent
Baldwin et al.

(10) Patent No.: US 7,316,764 B2
(45) Date of Patent: *Jan. 8, 2008

(54) SYSTEM AND METHOD FOR PERFORMING SPUTTER ETCHING USING INDEPENDENT ION AND ELECTRON SOURCES AND A SUBSTRATE BIASED WITH AN A-SYMMETRIC BI-POLAR DC PULSE SIGNAL

(75) Inventors: David Alan Baldwin, Annandale, VA (US); Todd Lanier Hylton, Vienna, VA (US)

(73) Assignee: 4 Wave, Inc., Sterling, VA (US)

( * ) Notice: Subject to any disclaimer, the term of this patent is extended or adjusted under 35 U.S.C. 154(b) by 775 days.

This patent is subject to a terminal disclaimer.

(21) Appl. No.: 10/812,409

(22) Filed: Mar. 29, 2004

(65) Prior Publication Data
US 2005/0006226 A1    Jan. 13, 2005

Related U.S. Application Data

(63) Continuation-in-part of application No. 10/200,578, filed on Jul. 22, 2002, now Pat. No. 6,723,209, which is a continuation-in-part of application No. 10/137,897, filed on May 2, 2002, now Pat. No. 6,679,976, which is a continuation-in-part of application No. 09/810,687, filed on Mar. 16, 2001, now Pat. No. 6,402,904, and a continuation-in-part of application No. 09/810,688, filed on Mar. 16, 2001, now Pat. No. 6,402,900.

(51) Int. Cl.
*C23C 14/35* (2006.01)

(52) U.S. Cl. .................... 204/192.33; 204/192.32; 204/298.31; 204/298.32; 204/192.34; 204/290.34; 204/298.36

(58) Field of Classification Search ........... 204/192.32, 204/192.33, 192.34, 298.31, 298.32, 298.34, 204/298.36
See application file for complete search history.

(56) References Cited

U.S. PATENT DOCUMENTS 4,693,805 A * 9/1987 Quazi .................... 204/192.22

(Continued)

*Primary Examiner*—Rodney G. McDonald
(74) *Attorney, Agent, or Firm*—Morgan, Lewis & Bockius LLP

(57) ABSTRACT

A system and method for performing sputter etching includes an ion source that generates an ion current that is directed at a substrate and an electron source that generates an electron current directed at the substrate. Biasing circuitry biases the substrate with an a-symmetric bi-polar DC voltage pulse signal. The biasing circuitry is formed from a positive voltage source with respect to ground, a negative voltage source with respect to ground and a high frequency switch. At least one current sensor, coupled to the biasing circuitry, monitors a positive current and a negative current from the substrate during one or more cycles of the a-symmetric bi-polar DC voltage pulse signal. A control system, coupled to the at least one current sensor, varies the ion current independently from the electron current. The ion and electron sources create a continuous plasma that is proximate the substrate and the biasing circuitry causes the substrate to alternatively attract ions and electrons from the plasma. The ions attracted from the plasma sputter etch the substrate. The electrons attracted from the plasma neutralize accumulated charge on the substrate.

5 Claims, 2 Drawing Sheets

U.S. PATENT DOCUMENTS 5,679,413 A * 10/1997 Petrmichl et al. ........... 427/534
6,402,904 B1 * 6/2002 Baldwin et al. ....... 204/192.13
6,679,976 B2 * 1/2004 Baldwin et al. ....... 204/192.12

* cited by examiner

SYSTEM AND METHOD FOR PERFORMING SPUTTER ETCHING USING INDEPENDENT ION AND ELECTRON SOURCES AND A SUBSTRATE BIASED WITH AN A-SYMMETRIC BI-POLAR DC PULSE SIGNAL

CROSS-REFERENCE TO RELATED APPLICATIONS

The present application is a continuation-in-part of U.S. patent application Ser. No. 10/200,578, filed Jul. 22, 2002, now U.S. Pat. No. 6,723,209 entitled "System and Method for Performing Thin Film Deposition or Chemical Treatment Using an Energetic Flux of Neutral Reactive Molecular Fragments, Atoms or Radicals" (incorporated herein by reference), which is a continuation-in-part of U.S. patent application Ser. No. 10/137,897, filed May 2, 2002, now U.S. Pat. No. 6,679,976 entitled "System and Method for Performing Sputter Deposition With Multiple Targets Using Independent Ion and Electron Sources and Target Biasing with DC Pulse Signals" (incorporated herein by reference), which is a continuation-in-part of Ser. No. 09/810,687, now U.S. Pat. No. 6,402,904, filed Mar. 16, 2001, entitled "System and Method for Performing Sputter Deposition Using Independent Ion and Electron Current Sources and a Target Biased with an A-Symmetric Bi-Polar DC Pulse Signal" (incorporated herein by reference) and a continuation-in-part of Ser. No. 09/810,688, now U.S. Pat. No. 6,402,900 filed Mar. 16, 2001, entitled "System and Method for Performing Sputter Deposition Using Ion Sources, Targets and Substrate Arranged About the Faces of a Cube."

FIELD OF INVENTION

The present invention is directed generally to novel systems and methods for performing sputter etching for material removal. More particularly, the present invention is directed to improved systems and methods for downstream plasma etching.

BACKGROUND OF THE INVENTION

Conventional plasma sputter etching methods include DC (direct-current) diode sputtering, capacitively-coupled radio-frequency (RF) sputtering and downstream plasma sputtering. The first two methods require relatively high gas pressure (1 to 50 mTorr) and are unable to sustain a plasma discharge at low electrode voltages (below ~300 volts). These characteristics limit the control of ion energies at the etched surface, particularly in the low energy regime, which may be important for low-damage etching of sensitive structures. The downstream plasma etching method uses a remote plasma source or plasma generator that, depending upon the characteristics of the plasma source, may allow lower pressure operation and may provide low-energy ion fluxes to the etched substrate. In most downstream plasma etching, a capacitively-coupled RF bias must still be applied to the substrate to accelerate ions to the substrate because the ion energies provided by the source would otherwise be too low to accomplish etching. Since the remote plasma source itself is often an inductively-coupled RF plasma generator, downstream plasma etching tends to be complex and expensive. Also, in common with simple capacitively-coupled RF sputtering, the capacitive coupling of RF power through the substrate to the plasma in downstream plasma etching has at least three limitations. (a) The angle of ion impact at the etched surface is constrained to normal incidence, since a thin plasma sheath at the substrate surface accelerates the ions toward the substrate. (b) The kinetic energy of the ions varies all the way from zero (as necessary for the substrate surface to become positively biased and receive a flux of electrons to neutralize positive surface charge build-up due to ion impact, on insulating substrates) to a kinetic energy characteristic of approximately the peak negative voltage of the RF waveform applied. (c) The substrate, being capacitively coupled, will self-adjust its electric potential (will "float") such that equal numbers, on average, of ions and electrons will reach the surface of the substrate, without regard to the detailed spatial structure of conductors and insulators on the surface of the substrate; if, for example, over neutralization by excess electron flux is desired, this is very difficult to arrange.

To overcome these limitations of the present plasma etching technology, it would be desirable to provide a remote plasma source, as is advantageous in downstream plasma etching, but provide a source which is cheaper and simpler. In addition, it would be advantageous for controlling ion incidence angle on the substrate if the remote plasma source could also accelerate ions toward the substrate region and that the substrate holder be variable in angle with respect to the accelerated ion flux. Furthermore, when it is advantageous to bias the substrate to further accelerate ions, it would be preferable to impose more controlled, deterministic and constant-valued negative voltages, so that the ion kinetic energy during etching is more nearly mono-energetic. Likewise, when it is advantageous to bias the substrate to attract electrons, it would be preferable to impose more controlled, deterministic and constant-valued positive voltages, so that variable amounts of electrons can controllably be delivered to the surface of the substrate. Moreover, it would be highly desirable to provide means for independently controlling the ion currents and the electron currents at the substrate. It would be beneficial to provide better control of the etching process without adding complex circuitry to the apparatus arrangement.

The present invention is directed to these objectives.

SUMMARY OF THE INVENTION

The present invention is directed to a system for performing sputter etching. Biasing circuitry biases a substrate with an a-symmetric bi-polar DC voltage pulse signal. The biasing circuitry is formed from a positive voltage source with respect to ground, a negative voltage source with respect to ground and a high frequency switch. At least one current sensor, coupled to the biasing circuitry, monitors a positive current and a negative current from the substrate during one or more cycles of the a-symmetric bi-polar DC voltage pulse signal. A control system, coupled to the at least one current sensor, varies the ion current independently from the electron current. The ion and electron sources create a continuous plasma that is proximate the substrate and the biasing circuitry causes the substrate to alternatively attract ions and electrons from the plasma. The ions attracted from the plasma sputter etch the substrate. The electrons attracted from the plasma neutralize accumulated charge on the substrate. In one embodiment, the controller varies the a-symmetric bi-polar DC voltage pulse signal used to bias the substrate independently from the ion and electron currents. In this embodiment, substrate voltages and currents are tailored to optimize etching performance.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1:
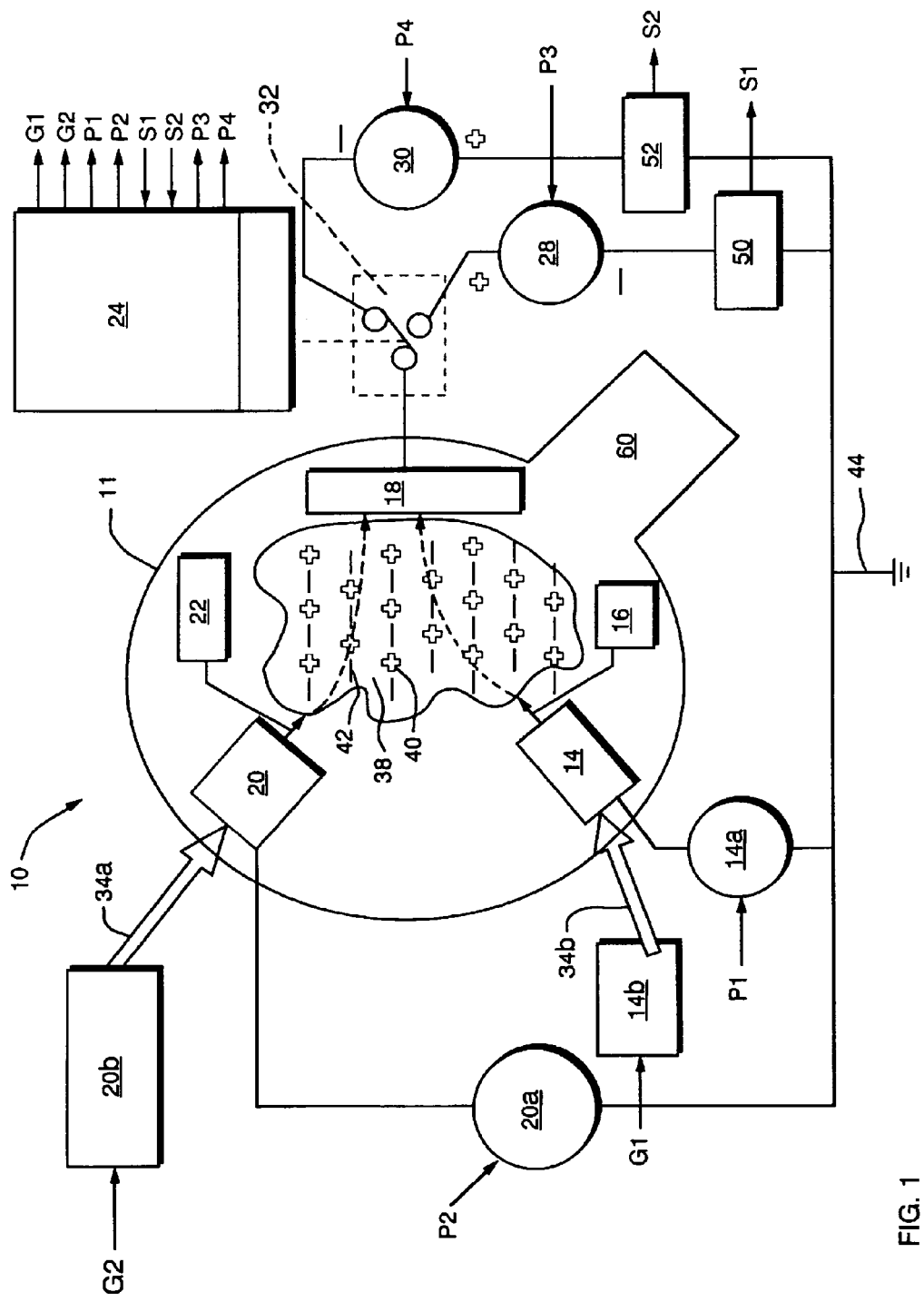
FIG. 1 is a schematic diagram of the system for performing sputter etching using independent ion and electron sources and a substrate biased with an A-Symmetric Bi-Polar DC pulse signal according to the present invention.

There is shown in FIG. 1, a system 10 for performing sputter etching for removal of material from substrate 18. System 10 comprises an ion source 14 that generates an ion current 16. The ion current 16 is directed primarily at substrate 18. System 10 further comprises an electron source 20 that generates an electron current 22. The electron current 22 is directed at the substrate 18. The ion source 14, the electron source 20 and the substrate 18 are disposed in a chamber 11. A vacuum pump 13 reduces the pressure within the chamber 11. The pressure within the chamber 11 during operation is about $10^{-3}$ to $10^{-5}$ torr.

Exemplary ion sources 14 useful for implementing the present invention include end-Hall or closed drift Hall ion sources such as the Mark II™ source of Commonwealth Scientific Corp/Veeco Instruments and the EH-1000 source of Kaufman & Robinson, Inc. Exemplary electron sources 20 useful for implementing the present invention include hollow cathode electron sources such Commonwealth Scientific Corp. or Veeco Instrument's HCES5000 or a plasma bridge electron source such as that offered by Commonwealth Scientific Corp. or Veeco Instruments.

A gas 34b (for example, Ar, Xe, $N_2$, or $O_2$) is supplied by a gas controller 14b (or mass flow controller) to ion source 14. Process controller 24 varies the volume of gas output by gas controller 14b. An ion source power supply 14a is coupled to the ion source 14, and supplies a control voltage to ion source 14. Process controller 24 varies the output of ion source power supply 14a. Control signals (from process controller 24) are supplied to both the ion source power supply 14a, and the ion source gas controller 14b, in order to vary the magnitude of ion current 16 at substrate 18. In one embodiment, ion current 16 will vary linearly with changes in the flow rate of gas 34b supplied to ion source 14. In addition, for a given flow rate of gas 34b supplied to ion source 14, the ion current 16 generated from the ion source and flowing toward substrate 18 will vary proportionately with the magnitude of the voltage control signal supplied by ion source power supply 14a to ion source 14.

A gas 34a (for example, Ar, Xe, or $N_2$) is supplied to electron source 20 by a gas controller (or mass flow controller) 20b. Gas 34a may be of a different type than gas 34b. Process controller 24 varies the volume of gas output by gas controller 20b. An electron source power supply 20a supplies a control voltage to electron source 20. Process controller 24 varies the voltage supplied to electron source 20 by electron power supply 20a. It will be understood by those skilled in the art that by varying the quantity of gas 34a supplied to electron source 20 and the voltage supplied by electron source power supply 20a to electron source 20, the electron current emanating from electron source 20 toward the substrate 18 may be controlled. In one embodiment, so long as a minimum quantity of gas 34a is supplied to electron source 20, the magnitude of the electron current 22 will vary linearly based on the magnitude of the signal supplied by the electron source power supply 20a to the electron source 20.

System 10 further includes a pair of current sensors 50, 52. Each of the current sensors has an output that is coupled to process controller 24. Each current sensor preferably includes a low pass filter with a time constant that is relatively long when compared with the frequency of switch 32 (e.g., about 100 KHz.) Each current sensor 50, 52, supplies a signal to process controller 24 that is proportional to the output of its corresponding voltage source 28, 30, averaged over time. Although in the embodiment shown, current sensors 50, 52 are shown as being disposed between voltage sources 28, 30, respectively, and ground, the current sensors 50, 52 could be positioned at any location in the circuitry useful for measuring the positive and negative currents at or near substrate 18.

Process controller 24 regulates the positive and negative currents at substrate 18 by varying independently the ion and electron currents 16, 22 with control signals P1, P2 to power supplies 14a, 20a, and control signals G1, G2 to gas controllers 14b, 20b. Such control is independent of the settings applied to voltage sources 28, 30, which may be chosen/varied to optimize other properties such as sputter etching qualities. In one embodiment, process controller 24 varies the ion current and electron current 16, 22, respectively, in order to deliver an equal amount of positive and negative charge to substrate 18 during each cycle of the a-symmetric bi-polar DC voltage pulse signal discussed below. Substrate neutralization is required, for example, to efficiently sputter material from the substrate when the substrate is insulating. In an alternative embodiment, process controller 24 varies the ion and electron currents 16, 22, respectively, so that about 10% more negative charge than positive charge is applied to substrate 18 during each cycle of the a-symmetric bi-polar DC voltage pulse signal. The purpose of this alternate embodiment is to assure neutralization of substrate 18. It will be understood by those skilled in the art that the relative percentages of positive and negative charge supplied to substrate 18 by the ion and electron currents 16, 22, respectively, during any given cycle of the a-symmetric bi-polar DC voltage pulse signal, are a matter of design choice, and that variations from the embodiments described herein are within the scope of the present invention.

Process controller 24 also includes a switch driver logic circuit that switches at about 100 KHz, but those skilled in the art will recognize that alternate types of pulse control systems may be used, including systems that operate at other frequencies. A switch signal (e.g. about 100 KHz) is supplied from process controller 24 to switch 32. Switch 32, together with biasing circuitry formed from a positive voltage source 28, and a negative voltage source 30, generate an a-symmetric bi-polar DC voltage pulse signal for biasing substrate 18 (such as the a-symmetric bi-polar DC voltage pulse signal shown in FIG. 2). The control signals P3 and P4 adjust the magnitude of the positive and negative voltages (in the a-symmetric bi-polar DC pulse signal) applied to the substrate 18 by the voltage sources 28, 30.

Figure 2:
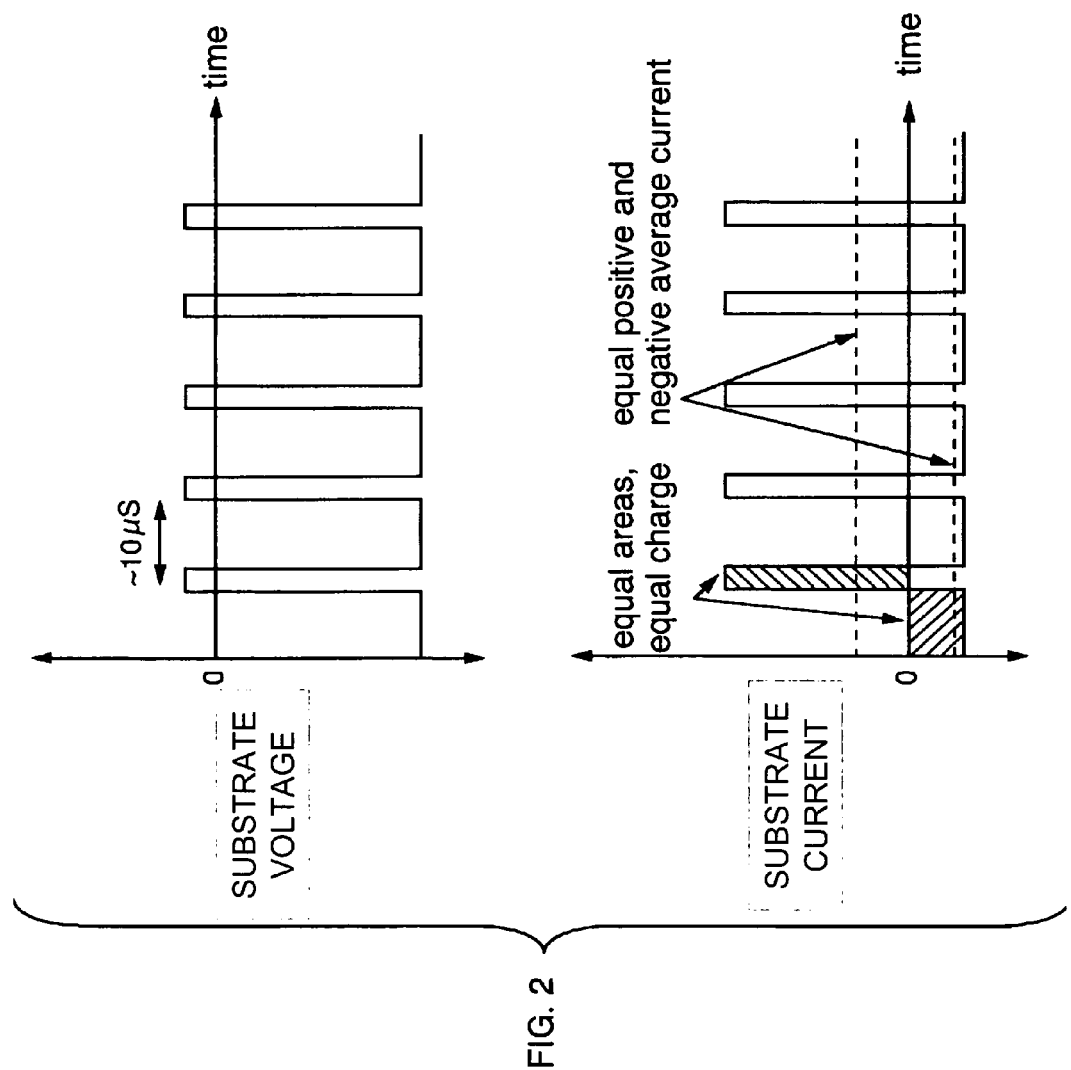
FIG. 2 shows an exemplary a-symmetric bi-polar DC pulse signal used for biasing a substrate, together with diagrams showing sensed electron and ion currents at the substrate during several cycles of the a-symmetric bi-polar DC pulse signal, according to the present invention.

Referring now to FIG. 2, there is shown a timing diagram showing several cycles of an exemplary a-symmetric bi-polar DC pulse signal, together with diagrams showing sensed positive and negative currents at the substrate 18 during several cycles of the a-symmetric bi-polar DC pulse signal, at a position proximate substrate 18. In the embodiment shown in FIG. 2, the amount of negative charge supplied by electron current 22 to substrate 18 during the positive portion of each cycle of the a-symmetric bi-polar DC voltage pulse signal is roughly equal to the amount of positive charge supplied by ion current 16 to substrate 18 during the negative portion of each cycle of the a-symmetric bi-polar DC voltage pulse signal. This condition is generally necessary to neutralize the substrate 18 on each cycle of the a-symmetric bi-polar DC voltage pulse signal.

During operation of system 10, gas 34a, 34b (such as Ar, Xe, $N_2$, and $O_2$) is fed through the ion source 14 and the electron source 20, and bias signals from power supplies 14a, 20a are applied to sources 14, 20, respectively, to create a continuous plasma 36 proximate the substrate 18. The a-symmetric bi-polar DC biasing signal causes the substrate 18 to alternatively attract ions 40 and electrons 42 from the plasma 38. The ions 40 attracted from the plasma 38 sputter etch the substrate 18 in order to remove material from the substrate. The electrons 42 attracted from the plasma 38 neutralize accumulated charge on the substrate 18. Voltage source 30 supplies a negative voltage with respect to ground 44, and voltage source 28 supplies a positive voltage with respect to ground 44. In one embodiment, voltage source 28 supplies a DC voltage of about 50 V, voltage source 30 supplies a DC voltage of about −1000V, and switch 32 toggles between its two poles at about 100 kHz. It will be understood by those skilled in the art that the particular voltage levels supplied by sources 28, 30, and the particular frequency of switch 32 are matters of design choice, and the exemplary values given should not be considered as limitative of the scope of the present invention.

A method for performing sputter etching of the substrate 18 using the system shown in FIG. 1, will now be described. Ion current 16 is generated and directed at the substrate 18 by the ion source 14. Electron current 22 is generated and directed at the substrate 18 by the electron source 20. The ion current 16, the electron current 22 and the a-symmetric bi-polar DC voltage pulse signal are independently controlled by the control system 24, by controlling voltage sources 28, 30, power supplies 14a, 20a, switch 32 and gas controllers 14b and 20b. The ion source 14 and electron source 20 create a continuous plasma 38 that is proximate the substrate 18. The biasing circuitry causes the substrate 18 to alternatively attract positive ions 40 and negative electrons 42 from the plasma 38. The ions 40 that are attracted from the plasma 38 sputter etch the substrate 18. The electrons 42 that are attracted from the plasma 38 neutralize positive charge that accumulates on the substrate 18 during the sputter etching phase. In one embodiment, the ensuing sputter etching of the substrate 18 is distributed uniformly over the substrate 18.

Use of the present invention allows for independent adjustment of ion and electron currents 16, 22 using relatively simple circuitry. In addition, by varying the voltages supplied by power supplies 28, 30 (using, for example, process controller 24) the upper and lower voltages in the a-symmetric bi-polar DC voltage pulse signal can be independently varied, thereby varying the voltages used to attract ions during the negative portion of the pulse cycle and electrons during the positive portion of the pulse cycle. In addition, it will be understood by those skilled in the art that, by varying the switching signal supplied to switch 32, the relative duration of the positive and negative portions of each cycle of the a-symmetric bi-polar DC voltage pulse signal can also be varied.

Independent control of each of these parameters affords independent control of plasma properties, sputter etching properties and substrate charge management during operation of system 10. For example, in one embodiment the ion kinetic energy E of the ion current 16 produced by the ion source 14 is adjusted to be between 20 eV and 200 eV, and the surface plane of the substrate 18 is tilted such that energetic ions produced by the ion source 14 approach the surface plane of the substrate 18 at an angle θ (as defined below). In this embodiment, the amplitude of negative voltage pulses applied to the substrate 18 are adjusted to a desired value of $V_{neg}$, and ions striking the substrate have an angle of incidence a which is represented by a vector sum of a velocity imparted by acceleration of the ion source and a velocity imparted by the negative voltage pulse amplitude applied to the substrate, in accordance with equation (1) below:

$$v_f/\sin\theta = v_i/\sin\alpha = v_E/\sin\beta, \quad (1)$$

in which $v_f$ is the final velocity of the ion, $v_i$ is the initial velocity of the ion (imparted by the ion source), $v_E$ is the velocity component imparted to the ion by the electric field of the negative substrate bias, θ is the angle between the substrate surface normal and the initial direction of the ion, α is the angle between the substrate surface normal and the final direction of the ion and β is the angle between the initial direction of the ion and the final direction of the ion. As a result, ions striking the substrate 18 remove material from the substrate due to sputtering at the angle α.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for performing sputter etching, comprising:
   (a) an ion source that generates an ion current directed at a substrate;
   (b) an electron source that generates an electron current directed at the substrate;
   (c) biasing circuitry that biases the substrate with an a-symmetric bi-polar DC voltage pulse signal, the circuitry being formed from a positive voltage source with respect to ground, a negative voltage source with respect to ground and a high frequency switch;
   (d) at least one current sensor, coupled to the biasing circuitry, that monitors a positive current and a negative current from the substrate during one or more cycles of the a-symmetric bi-polar DC voltage pulse signal;
   (e) a controller, coupled to the at least one current sensor, that varies the ion current independently from the electron current;
   (f) wherein the ion and electron sources create a continuous plasma proximate the substrate, and the biasing circuitry causes the substrate to alternatively attract ions and electrons from the plasma;
   (g) wherein the ions attracted from the plasma sputter etch the substrate; and
   (h) wherein the electrons attracted from the plasma neutralize accumulated charge on the substrate.

2. The system of claim 1, wherein the ion source, the electron source and the substrate are disposed in a chamber having a pressure between $10^{-3}$ to $10^{-5}$ torr during operation of the system.

3. The system of claim 1, wherein the controller varies the a-symmetric bi-polar DC voltage pulse signal used to bias the substrate independently from the ion and electron currents.

4. A method for performing sputter etching, comprising:
  (a) generating an ion current directed at a substrate by an ion source;
  (b) generating an electron current directed at the substrate by an electron source;
  (c) biasing the substrate with biasing circuitry that generates an a-symmetric bi-polar DC voltage pulse signal, the circuitry being formed from a low voltage source, a high voltage source and a high frequency switch;
  (d) monitoring, with at least one current sensor coupled to the biasing circuitry, a positive current and a negative current from the substrate during one or more cycles of the a-symmetric bi-polar DC voltage pulse signal;
  (e) varying, with a controller coupled to the at least one current sensor, the ion current independently from the electron current;
  (f) wherein the ion and electron sources create a continuous plasma proximate the substrate, and the biasing circuitry causes the substrate to alternatively attract ions and electrons from the plasma;
  (g) wherein the ions attracted from the plasma sputter etch the substrate; and
  (h) wherein the electrons attracted from the plasma neutralize accumulated charge on the substrate.

5. The method of claim 4, further comprising:
  adjusting an ion kinetic energy E of the ion current produced by the ion source to between 20 eV and 200 eV;
  tilting a surface plane of the substrate such that energetic ions produced by the ion source approach the surface plane of the substrate at an angle $\theta$ between normal incidence and grazing incidence;
  adjusting an amplitude of negative voltage pulses applied to the substrate to a desired value of $V_{neg}$;
  wherein ions striking the substrate have an angle of incidence $\alpha$ which is represented by a vector sum of a velocity imparted by acceleration of the ion source and a velocity imparted by the negative voltage pulse amplitude applied to the substrate; and
  wherein ions striking the substrate remove material from the substrate due to sputtering at the angle $\alpha$.

* * * * *